United States Patent [19]

Ma

[11] 3,896,403

[45] July 22, 1975

[54] TOUCH-TUNING SYSTEM FOR A TELEVISION RECEIVER

[75] Inventor: John Ma, Glenview, Ill.

[73] Assignee: Zenith Radio Corporation, Chicago, Ill.

[22] Filed: May 3, 1974

[21] Appl. No.: 466,593

[52] U.S. Cl. ........................ 334/15; 334/39; 334/87

[51] Int. Cl.$^2$ ........................ H03J 5/04; H03J 1/04

[58] Field of Search ........................ 334/15-16, 334/39, 86-87

[56] References Cited

UNITED STATES PATENTS

| | | | |
|---|---|---|---|
| 3,440,544 | 4/1969 | Pampel | 334/15 |
| 3,644,853 | 2/1972 | Ma | 334/16 |
| 3,720,876 | 3/1973 | Montgomery | 334/87 |
| 3,787,788 | 1/1974 | LeFevre | 334/86 |
| 3,835,395 | 9/1974 | Smith | 334/15 |

*Primary Examiner*—Alfred E. Smith
*Assistant Examiner*—Wm. H. Punter
*Attorney, Agent, or Firm*—Nicholas A. Camasto

[57] ABSTRACT

A television receiver includes a plurality of tuning positions each defined by an adjustable potentiometer, a neon bulb indicator, a UHF/VHF switch and a two pole momentary contact touch switch. A common tuning capacitor has a tuning voltage developed thereacross for controlling the tuning of a varactor diode tuner. A source of reference potential is coupled across the tuning potentiometers and closure of any touch switch results in the tuning capacitor being charged from the voltage reference source through the selected one of the tuning potentiometers. The neon bulbs yield a visual indication of the selected tuning position. Circuitry for automatically placing control of the tuner to a preselected one of the tuning positions upon turn on of the receiver is also included.

3 Claims, 1 Drawing Figure

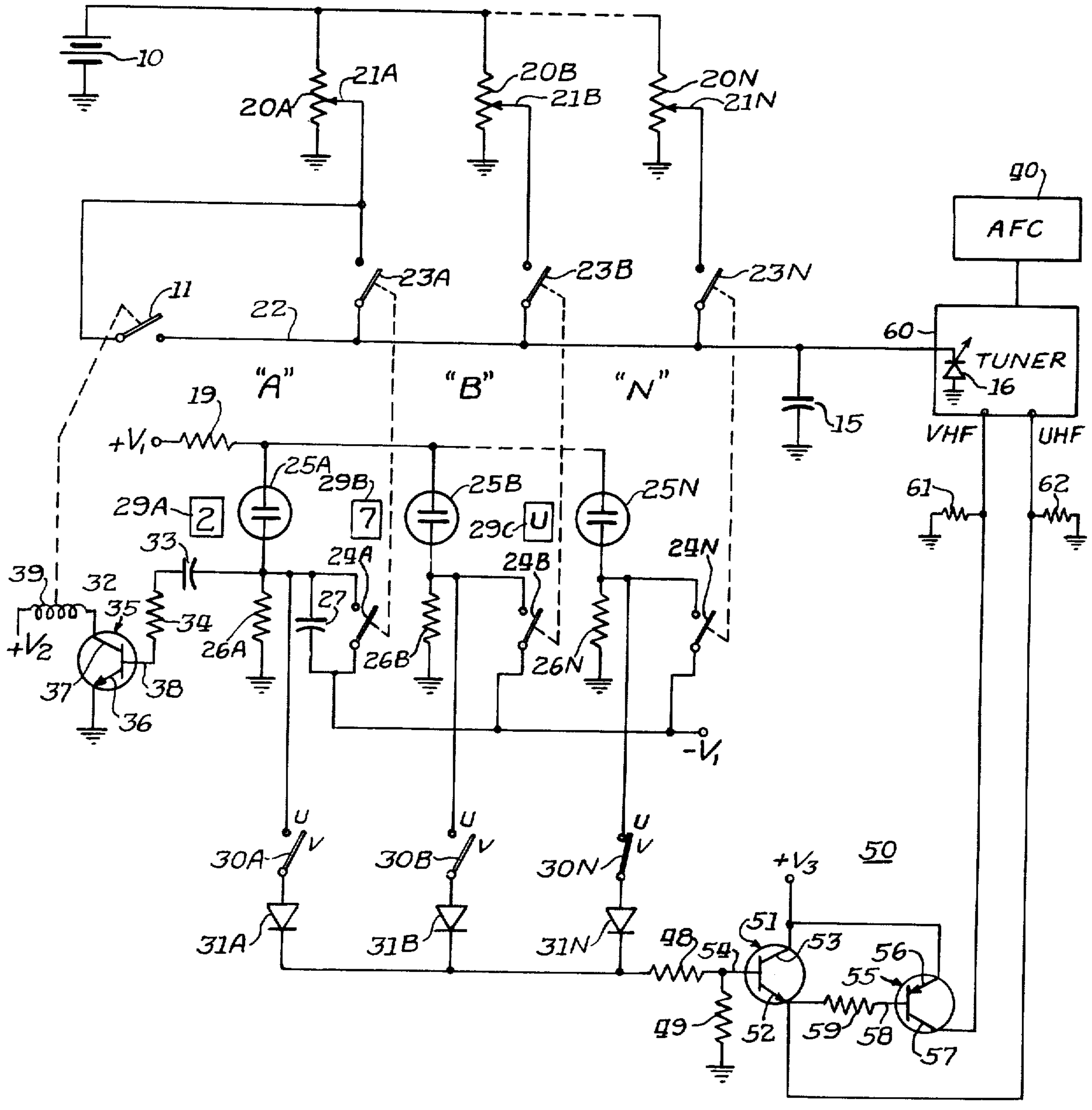
10
20A
21A
20B
21B
20N
21N
90
AFC
11
22
23A
23B
23N
60
TUNER
16
"A"
"B"
"N"
15
VHF
UHF
19
$+V_1$
25A
25B
25N
29A
2
29B
7
29C
U
61
62
33
39
32
35
34
24A
24B
24N
27
$+V_2$
26A
26B
26N
37
38
36
$-V_1$
U
V
30A
30B
30N
31A
31B
31N
$+V_3$
50
51
53
56
55
48
54
49
52
59
58
57

TOUCH-TUNING SYSTEM FOR A TELEVISION RECEIVER

BACKGROUND OF THE INVENTION

This invention relates in general to television tuning systems incorporating varactor diodes as the controlling elements.

Varactor diode tuners and television tuning systems incorporating such tuners are well known as are their advantages over mechanically tuned tuners. Because of their silent, high speed tuning capabilities, it is desirable to incorporate varactor diode tuners in so-called touch-tuning arrangements which require only a momentary effort on the part of the operator to change the television receiver tuning. Numerous touch-tuning circuits have been proposed which incorporate semiconductor switches for coupling the appropriate tuning voltage to the varactor diode in the tuner. These semiconductor switches exhibit an undesirable "contact resistance" which varies as a function of temperature and such tuning systems manifest decided tuning drift problems.

OBJECTS OF THE INVENTION

A primary object of this invention is to provide a novel television tuning system.

A further object of this invention is to provide a novel, economical touch-tuning system for a television receiver.

Another object of this invention is to provide a varactor diode touch-tuning system which avoids temperature drift problems.

SUMMARY OF THE INVENTION

In accordance with the invention, a touch-tuning system for a television receiver includes a varactor diode tuner, a source of reference potential, a plurality of variable resistance elements connectable between said source of reference potential and a tuning capacitor, and viewer operable momentary contact switches for momentarily connecting any selected one of the variable resistance elements to the tuning capacitor for establishing a corresponding tuning voltage thereacross.

BRIEF DESCRIPTION OF THE DRAWING

The single FIGURE of the drawing depicts a combination block and schematic diagram of a touch-tuning system constructed in accordance with the invention.

DESCRIPTION OF THE PREFERRED EMBODIMENT

Referring to the FIGURE, a source of reference potential 10 (indicated as a battery) has its negative terminal connected to ground and its positive terminal connected to a plurality of variable resistances indicated as potentiometers 20A, 20B . . . 20N. The letters A, B . . . N indicate a plurality of N tuning positions and it should be understood that structural elements bearing these letter suffixes are associated with the corresponding tuning positions. In general, N may be 14 or 16, indicating a television receiver having a like number of presettable tuning positions which may be programmed to receive any of a number of broadcast television signals. Each potentiometer incorporates a movable tap connectable through a plurality of momentary contact switches 23A, 23B . . . 23N to a tuning line 22 supplying a tuning capacitor 15. The momentary contact switches are shown as single pole, single throw types but may readily take the form of two pole types. As such, the switches numbered 23A . . . 23N would incorporate as their respective other poles, the switches 24A . . . 24N, to be described.

Tuning capacitor 15 is connected across a tuner 60, which will be understood to include appropriate frequency selective circuits (not shown) including at least one varactor diode 16 which changes its capacitance in response to an applied DC potential. A source of AFC voltage 40, indicated in block form, is also coupled to tuner 60. It will be appreciated that in all respects AFC source 40 is conventional and as such needs no further description in this context. For example, AFC source 40 includes means for maintaining the tunable elements of tuner 60 "locked onto" the selected television channel carrier frequency.

It will be apparent that upon closure of any of the momentary contact touch switches 23A, 23B . . . 23N, tuning capacitor 15 is charged from reference source 10, through the tapped portion of the selected tuning potentiometer and the selected touch switch. If, for example, tuning position B is selected, as evidenced by momentary closure of touch circuit 23B, a circuit is completed from reference source 10, through the portion of tuning potentiometer 20B above tap 21B, through tap 21B, through closed switch 23B, to tuning line 22 and tuning capacitor 15. Tuning capacitor 15 is charged and develops a tuning potential across its terminals which is a direct function of the setting of potentiometer 20B. This tuning potential is impressed upon the varactor diode 16 in tuner 60 for tuning tuner 60 to the television carrier frequency desired.

In practice, during initial "setup" of the receiver the touch switch at a tuning position is held closed while its associated tuning potentiometer is adjusted to tune the receiver to the desired television channel. The procedure is repeated for each tuning position. During this process, it may be desirable to disable the AFC circuit to facilitate tuning to the carrier frequency. As a practical expedient, the tuning potentiometers may conveniently be hidden behind a door on the receiver (since they are only used for setup of channels) and an AFC defeat switch incorporated as a door interlock, which is operated when the door is opened.

It will be seen that because of the momentary nature of the touch switches the charge stored in capacitor 15 is not dissipated, nor is the tuning voltage developed by the capacitor dependent upon any elements which change in value with changes in temperature. Consequently, varactor diode 16 in tuner 60 "sees" a stable potential across tuning capacitor 15 and the tuning of tuner 60 does not drift with temperature.

A plurality of neon tuning indicators 25A, 25B . . . 25N yield a continuous visual indication of the controlling or active tuning position. A source of DC voltage $+V_1$ is coupled through a voltage dropping resistor 19 to one terminal of each of the neon indicators. Their other terminals are connected to ground through a corresponding plurality of resistors 26A, 26B . . . 26N. The junctions of these grounding resistors and the neon indicators are connected through a plurality of momentary contact touch switches 24A, 24B . . . 24N to a DC voltage source labelled $-V_1$. As mentioned above, these momentary contact switches are operable in unison with their corresponding touch switches 23 as indicated by the dashed lines joining them and switches 23 and 24 may form one pole each of two pole switches. The combination of source $+V_1$ and the value of resistor 19 and each of resistors 26 is such that, when one of the neon indicators is conducting, the potential across the remaining indicators is too low to cause ignition. As will be seen, subsequent closure of any other touch switch will result in $-V_1$ being applied to the lower terminal of its associated neon indicator causing it to conduct and terminate conduction in the previously conductive neon indicator.

When the receiver is initially turned on or energized, the neon indicator in position A is driven into conduction and the voltage developed across resistor 19 precludes any other neon bulb from reaching its ignition potential. This is due to a capacitor 27 connected across touch switch 24A. When the receiver is off, capacitor 27 is discharged (through resistor 26A and source $-V_1$). Upon turn on of the receiver, capacitor 27 charges from $-V_1$ and in so doing develops a decreasing negative potential at the lower terminal of neon indicator 25A. Since $+V_1$ is applied to the upper terminals of all the neon indicators, indicator 25A is subjected to the largest potential difference and it conducts. In conducting, it draws current through resistor 19 which keeps the voltage across the remaining neon indicators below their ignition potential.

Control is transferred from one tuning position to another by closing the desired touch switch, which places $-V_1$ at the lower terminal of its neon indicator causing it to conduct. (The combination of the voltage across the neons, when one is conducting, and $-V_1$ is greater than the ignition potential.) This increases the current flow through resistor 19 and lowers the potential across neon indicators 25A to below its sustaining potential causing neon indicator 25A to cease conducting. Contemporaneously with the closure of any of the touch switches 24, its corresponding touch switch 23 is activated and the voltage across tuning capacitor 15 is adjusted to tune tuner 60 to the television channel programmed at that tuning position. Thus control of the television tuner 60 is transferred to the new tuning position.

It was demonstrated that when the receiver is turned on, neon indicator 25A is driven into conduction by the action of capacitor 27. However, the receiver will most likely not be tuned to the television channel programmed at position A. To assure that the receiver also tunes to the channel programmed at position A, a position return circuit 32 is incorporated. This circuit comprises an NPN transistor 35 having a grounded emitter electrode 36, a collector electrode 37, coupled to a source of voltage $+V_2$ through a relay coil 39, and a base electrode 38 coupled through a resistor 34 and a capacitor 33 to the junction of neon indicator 25A and its ground resistor 26A. Relay 39 operates a switch 11 which is connected in parallel with touch switch 23A. Upon conduction in neon indicator 25A, base 38 of transistor 35 is driven positive by the charging of capacitor 33. Conduction occurs in the collector-emitter path of transistor 35 and relay coil 39 is energized. Relay coil 39 closes switch 11 which causes capacitor 15 to assume a tuning potential for varactor diode 16 in tuner 60 corresponding to the television channel determined by the setting of tuning potentiometer 20A. As capacitor 33 reaches a fully charged condition, the base-emitter potential of transistor 35 decreases and conduction ceases. Relay coil 39 is de-energized and switch 11 opened. Thus the receiver tuning reverts to that programmed at position A upon turn on.

A plurality of non-momentary contact single pole switches 30A, 30B . . . 30N are provided for UHF/VHF band selection and are respectively connected from the lower terminals of the neon indicators through a plurality of isolation diodes 31A, 31B . . . 31N to a bandswitch circuit 50. Bandswitch 50 comprises a source of voltage $+V_3$ supplying the collector 53 of an NPN transistor 51 and the emitter 56 of a PNP transistor 55. The emitter 52 of transistor 51 is connected through a resistor 59 to the base 58 of transistor 55. Base 54 of transistor 51 is connected to the junction of a resistor 48 and a grounded resistor 49. Emitter 52 is connected to tuner 60 at a terminal labelled UHF. Similarly collector 57 of transistor 55 is connected to tuner 60 at a terminal labelled VHF. A resistor 61 is shown connected between the VHF terminal and ground and a resistor 62 similarly shown between the UHF terminal and ground. These resistors are symbolic and are used to represent circuitry within tuner 60.

Transistors 51 and 55 act as a toggle, that is, only one can be in conduction at any time. Assuming that the television channel programmed at tuning position A corresponds to a VHF channel, U/V switch 30A is in its open or V position as shown and transistor 51 is nonconductive because its base-emitter junction is not forward biased. Transistor 55, on the other hand, has its emitter-base junction forward biased from $+V_3$ through resistor 59 and resistor 62 and is in conduction. Its collector 57 thus places an appropriate potential on the VHF terminal of tuner 60. (Current flow in resistor 59 also back biases transistor 51 to hold it nonconductive.)

Position N has its U/V switch 30N closed (in the U position), indicating a UHF channel and a positive potential due to conduction in neon indicator 25N is transmitted through diode 31N, through resistor 48, to the base of transistor 51 driving this transistor into conduction. When transistor 51 conducts, the potential developed at its emitter cuts off transistor 55 and impresses a suitable potential on the UHF terminal of tuner 60. The U/V switches are appropriately set by the viewer or serviceman when the television receiver is programmed.

The U/V switches may also be set automatically in conjunction with insertion of a plurality of indicating tabs 29A, 29B . . . 29N at the various tuning positions in proximity to their corresponding neon indicators for identifying the number of the television channel programmed at the tuning position. As fully described and claimed in U.S. Pat. No. 3,835,395 issued Sept. 10, 1974, assigned to the same assignee of the present invention, the indicating tabs are arranged to operate the U/V switches in accordance with their individual channel number designations. Thus the viewer need not concern himself with setting the U/V switches during programming.

What has been described is a novel varactor diode television tuning system which is simple, economical and free of temperature drift problems. While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A touch-tuning system for a television receiver including an AFC circuit and being tunable over both the VHF and UHF frequency bands at each of a plurality of tuning positions comprising; a tuner including a varactor diode tuning element; a source of DC reference potential; a plurality of potentiometers individually located at respective ones of said tuning positions and each coupled across said source of DC reference potential, said potentiometers each having a movable tap; a tuning capacitor coupled to said varactor diode; viewer-operated momentary contact switch means selectively connecting said movable taps to said tuning capacitor for establishing the tuning voltage thereacross in accordance with the setting of the corresponding potentiometer; said momentary contact switch means including a two-pole mechanical switch at each said tuning location, one pole of each switch being connectable to said movable taps; a plurality of neon tube indicators, coupled to a voltage source through a common resistance for precluding energization of more than one of said indicators at the same time, respective ones of said plurality of indicators being individually located at each said tuning position; means, including said second pole on each said switch for selectively energizing said neon indicators by momentary operation of the switch at the corresponding tuning position; bandswitching means normally operating said tuner in said VHF frequency band; and a U/V bandswitch at each said tuning position for conditioning said bandswitching means for operating said tuner in said UHF frequency band.

2. A touch-tuning system as in claim 1, including means establishing control of said tuner at a predetermined one of said tuning positions upon energization of said television receiver.

3. A touch-tuning system as in claim 2, wherein said last-mentioned means include a transistor having a charging circuit energizing the neon indicator at said predetermined tuning position and a load current-operated switch in parallel with said one pole of the mechanical switch at said predetermined tuning position.

* * * * *